US008076576B2

(12) United States Patent
Kumatani et al.

(10) Patent No.: US 8,076,576 B2
(45) Date of Patent: Dec. 13, 2011

(54) ELECTRONIC COMPONENT PACKAGE

(75) Inventors: Kazuhiko Kumatani, Kakogawa (JP); Yoshihisa Takano, Kakogawa (JP); Naotoshi Nakamura, Kakogawa (JP); Mototsugu Ogasa, Kakogawa (JP); Takashi Nakamura, Kakogawa (JP); Minoru Iizuka, Kakogawa (JP)

(73) Assignee: Daishinku Corporation, Kakogawa-shi (JP)

( * ) Notice: Subject to any disclaimer, the term of this patent is extended or adjusted under 35 U.S.C. 154(b) by 281 days.

(21) Appl. No.: 12/445,124

(22) PCT Filed: Oct. 19, 2007

(86) PCT No.: PCT/JP2007/070407

§ 371 (c)(1),
(2), (4) Date: Apr. 28, 2009

(87) PCT Pub. No.: WO2008/059693

PCT Pub. Date: May 22, 2008

(65) Prior Publication Data

US 2010/0006315 A1 Jan. 14, 2010

(30) Foreign Application Priority Data

Nov. 15, 2006 (JP) ................................ 2006-309593

(51) Int. Cl.
*H01L 23/02* (2006.01)
*H05K 5/06* (2006.01)

(52) U.S. Cl. .................................... 174/50.51; 174/564

(58) Field of Classification Search .................. 174/564, 174/560, 535, 50.51; 257/732
See application file for complete search history.

(56) References Cited

U.S. PATENT DOCUMENTS 3,857,993 A * 12/1974 Gregory ........................ 174/555
4,888,449 A * 12/1989 Crane et al. ................... 174/540
6,229,088 B1 * 5/2001 Launtz ....................... 174/50.51
7,745,725 B2 * 6/2010 Paterek et al. ............ 174/50.52
7,755,189 B2 * 7/2010 Nishiyama .................... 257/733

FOREIGN PATENT DOCUMENTS

JP 04-004982 A 1/1992
JP 05-037280 A 2/1993
JP 2002-011579 A 1/2002

* cited by examiner

*Primary Examiner* — Hung Ngo

(74) *Attorney, Agent, or Firm* — Marvin A. Motsenbocker; Mots Law, PLLC

(57) ABSTRACT

There is provided an electronic component package, in which electronic component element is mounted on a metal base, the electronic component element is covered by placing a metal cap over the metal base, and the metal base and the metal cap are joined by resistance welding to hermetically seal the electronic component element. With this electronic component package, a protrusion is provided to a portion of the metal base that comes into contact with the metal cap, and a projection tip of the protrusion has a flat face. Alternatively, the protrusion has a cross sectional shape that combines an arc member with the top side of an isosceles trapezoid.

6 Claims, 6 Drawing Sheets

ELECTRONIC COMPONENT PACKAGE

TECHNICAL FIELD

The present invention relates to an electronic component package, in which a metal base and a metal cap are joined by resistance welding to hermetically seal an electronic component element in an electronic component such as a crystal resonator.

BACKGROUND ART

Examples of electronic components include crystal resonators, crystal filters, crystal oscillators, and other such piezoelectric resonator devices. With these piezoelectric resonator devices, a metal thin film electrode is formed on the surface of a crystal resonator plate (piezoelectric resonator plate) as an electronic component element, and this crystal resonator plate is hermetically sealed into a package (an electronic component package formed by a metal base being resistance welded to a metal cap) in order to protect the metal thin film electrode from the outside atmosphere. These crystal resonators are widely used as sources of reference for frequency and time because of their outstanding resonance characteristics.

The package shown in FIG. 11 (a cross-sectional view illustrating a conventional example) and FIG. 12 (an enlarged cross-sectional view of a welded portion in FIG. 11) is an example of a conventional electronic component package in which a metal base and a metal cap are joined by resistance welding to hermetically seal an electronic component element. As shown in FIGS. 11 and 12, with this conventional package, a flange 913 is formed on a metal base 91, and a triangular protrusion 914 is formed on this flange 913.

As shown in FIG. 11, this package includes slender, cylindrical metal lead terminals 911 and 912 that are erected passing through the package via insulating glass (not shown). A metal cap 92 includes an element compartment 915 and a flange 921. The metal base 91 or the metal cap 92 is plated with nickel or another such metal (not shown). A crystal resonator plate 93, which is an electronic component element, is mounted on the metal base 91, the crystal resonator plate 93 is covered with the metal cap 92, and power is electrically turned on in a state in which the protrusion 914 on the flange 913 of the metal base 91 has been press-bonded to the flange 921 of the metal cap 92, which melts the protrusion 914 and the metal plating and joins the metal base 91 and the metal cap 92 by resistance welding. The welding current is locally concentrated in the protrusion 914 during resistance welding, and this raises welding efficiency.

With a configuration such as this, however, in the resistance welding of the metal base 91 and the metal cap 92, the flange 921 of the metal cap 92 comes into contact with the protrusion 914, and this contact can crush the protrusion 914 or cause the metal plating to peel off. Also, when the protrusion 914 comes into contact with the flange 921, metal microparticles may be scattered, which is known as splash. These scattered metal microparticles often find their way inside the metal base 91, and if the electronic component is a crystal resonator or the like, the metal microparticles will adhere to the electrode surfaces of the electronic component element (the crystal resonator plate 93), causing electrode shorting, capacity fluctuation, and other such adverse effects to the characteristics.

In view of this, one of the ways proposed in the past for dealing with such problems, as disclosed in Patent Document 1, for example, is to have the apex of the protrusion located no more than 25% from the outer end of the flange of the metal base with respect to the total width of the flange. More specifically, the cross sectional shape of the protrusion is made to be a substantially right triangle with a gentle slope on the inside and the outer side cut off, and this reduces splash from getting into the interior.

Patent document 1: JP H6-9226U

DISCLOSURE OF INVENTION

Problem to be Solved by the Invention

However, although the adverse effect of splash is indeed reduced by using a substantially right triangular protrusion such as that disclosed in Patent Document 1, when pressure is applied during resistance welding, there tends to be variance in the pressing force between the inner and outer faces of the protrusion, and as a result the welded region is sometimes uneven. Also, since the apex of the protrusion is nearer the outside (displaced) with respect to the total width of the flange of the metal base, an incomplete welding region is produced, the result being that the sealing tends to be inconsistent. Also, since the flange of the metal cap may slide to the inside during resistance welding, so that it is welded in a state of being shifted inward, the metal cap sometimes exerts a force on the metal base that presses it to the inside. As a result, stress is applied all the way to the region of the metal base where the insulating glass is present, so adhesion may be poor between the metal base and the insulating glass.

The present invention was conceived in order to solve the above problems, and it is an object thereof to provide an electronic component package in which an electronic component element is hermetically sealed by joining a metal base and a metal cap by resistance welding, and even if splash should occur, it will not adversely affect the characteristics of the electronic component and variance will tend not to occur during hermetically sealing, resulting in higher reliability.

Means for Solving Problem

In view of this, to achieve the stated object, the present invention is an electronic component package in which an electronic component element is mounted on a metal base, the electronic component element is covered by placing a metal cap over the metal base, and the metal base and the metal cap are resistance welded to hermetically seal the electronic component element, wherein a protrusion is provided to a portion of the metal base that comes into contact with the metal cap, and a projection tip of the protrusion has a flat face.

With the present invention, the occurrence of splash is suppressed so that it does not adversely affect the characteristics of the electronic component, and furthermore it is less likely that there will be variance during hermetically sealing. More specifically, during the resistance welding of the metal base and the metal cap, there will be no scattering of metal microparticles from the protrusion, and no unevenness in the welded region.

Also, with the above constitution, the protrusion may have an isosceles trapezoidal cross sectional shape. Further, with this constitution, the protrusion may have an isosceles trapezoidal cross sectional shape, and an apex angle formed by extensions of the two equal sides of the trapezoid may be set to a range of from 60° to 90°.

In this case, since the protrusion forms an isosceles trapezoid, when the metal cap is pressed against the protrusion of the metal base during resistance welding, the stress applied to the apex portion of the protrusion (the projection tip) will be uniform, the molten metal will quickly connect up with two equal sloped sides of the trapezoid, and the bulging portion of the protrusion is formed along the sloped sides of the trapezoid, so the formation of the bulging portion of the protrusion is reduced and the occurrence of splash can be suppressed. As a result, any metal microparticles caused by splash will not find their way inside the metal base, so those metal microparticles will not adhere to the electrode surfaces of the electronic component element (such as a crystal resonator piece), which completely eliminates electrode shorting, capacity fluctuation, and other such adverse effects to the characteristics.

Also, with the above constitution, the height of the protrusion may be set to 50 μm or less. More specifically, the height of the protrusion when the metal cap and the metal base are joined is preferably set to between 30 and 40 μm.

In this case, the electrical discharge that occurs during resistance welding of the metal cap and the metal base can be suppressed, and as a result it is possible to drastically suppress the occurrence of splash.

Also, to achieve the stated object, the present invention is an electronic component package, in which electronic component element is mounted on a metal base, the electronic component element is covered by placing a metal cap over the metal base, and the metal base and the metal cap are resistance welded to hermetically seal the electronic component element, wherein a protrusion is provided to a portion of the metal base that comes into contact with the metal cap, and the protrusion has a cross sectional shape that combines an arc member with the top side of an isosceles trapezoid, and an apex angle formed by extensions of the two equal sides of the trapezoid is set to a range of from 60° to 90°.

With the present invention, the occurrence of splash is suppressed so that it does not adversely affect the characteristics of the electronic component, and furthermore it is less likely that there will be variance during hermetically sealing. More specifically, during the resistance welding of the metal base and the metal cap, there will be no scattering of metal microparticles from the protrusion, and no unevenness in the welded region.

More specifically, with the present invention, since a protrusion is provided to the portion of the metal base that comes into contact with the metal cap, and the protrusion has a cross sectional shape that combines the arc member with the top side of the isosceles trapezoid, and the apex angle formed by extensions of the two equal sides of the trapezoid is set to a range of from 60° to 90°, when the metal cap is pressed against the protrusion of the metal base during resistance welding, the stress applied to the apex portion of the protrusion (the projection tip) will be dispersed, which greatly reduces the formation of a bulge in the protrusion and dramatically suppresses the occurrence of splash. As a result, any metal microparticles caused by splash will not find their way inside the metal base, so those metal microparticles will not adhere to the electrode surfaces of the electronic component element (such as a crystal resonator piece), which completely eliminates electrode shorting, capacity fluctuation, and other such adverse effects to the characteristics. Also, since the protrusion has a shape that combines the arc member with the top side of the isosceles trapezoid, variance in the pressing force between the inner and outer faces of the protrusion is less likely to occur, and pressure is applied uniformly everywhere except the bulging portion of the protrusion during resistance welding, so the pressing force is more stable and the welded region is also more uniform and stable, and as a result there is no variance in sealing. A problem is also eliminated in which the electronic component (such as a crystal resonator piece) is not hermetically sealed due to variance in sealing, diminishing the aging characteristics.

Also, when the trapezoid, and the apex angle formed by extensions of the two equal sides of the trapezoid is set to a range of from 60° to 90°, this maintains a state in which welding current is locally concentrated in the protrusion during resistance welding, so there is no decrease in welding efficiency, and furthermore this configuration is ideal for suppressing the infiltration of metal microparticles caused by splash. In addition, crushing of the protrusion is kept to a minimum, and the occurrence of splash is itself suppressed. This is because if the trapezoid, and the apex angle formed by extensions of the two equal sides of the trapezoid is set to less than 60°, when the metal cap is pressed against the protrusion of the metal base, a bulging portion of the protrusion will tend to be formed, the stress applied to the top side portion and the apex portion of the protrusion will not be completely dispersed, and as a result, the occurrence of splash cannot be suppressed. On the other hand, if the trapezoid, and the apex angle formed by extensions of the two equal sides of the trapezoid is set to more than 90°, resistance welding efficiency will decrease, so the resistance welder output will have to be increased for hermetic sealing, and as a result splash will be more apt to occur.

Also, with the above constitution, a metal coat of nickel may be formed in a thickness of 2 to 6 μm on the surface of the metal base.

In this case, when power is turned on in a state in which the cap has been press-bonded to the protrusion of the base during resistance welding, if the thickness of the metal coat of nickel formed on the upper face of the protrusion is between 2 and 6 μm, there will be no decrease in its rustproofing function, nor will the nickel coat be excessively melted. In particular, if the nickel coat is thinner than 2 μm, the rustproofing effect of the metal base will be weak, and this may lead to a decrease in the electrical characteristics of the electronic component after hermetic sealing. As a result, it is possible to suppress an adverse effect of splash not only from the protrusion, but also from the nickel coat, so the anti-splash effect is further enhanced.

EFFECTS OF THE INVENTION

With the constitution of the present invention, a highly reliable electronic component package can be provided with which an electronic component element is hermetically sealed by joining a metal base and a metal cap by resistance welding, and even if splash should occur, it will not adversely affect the characteristics of the electronic component, and variance during hermetic sealing will be less likely to occur.

DESCRIPTION OF REFERENCE NUMERALS

1 metal base
14 protrusion
2 metal cap
3 crystal resonator plate

BEST MODE FOR CARRYING OUT THE INVENTION

Figure 1:
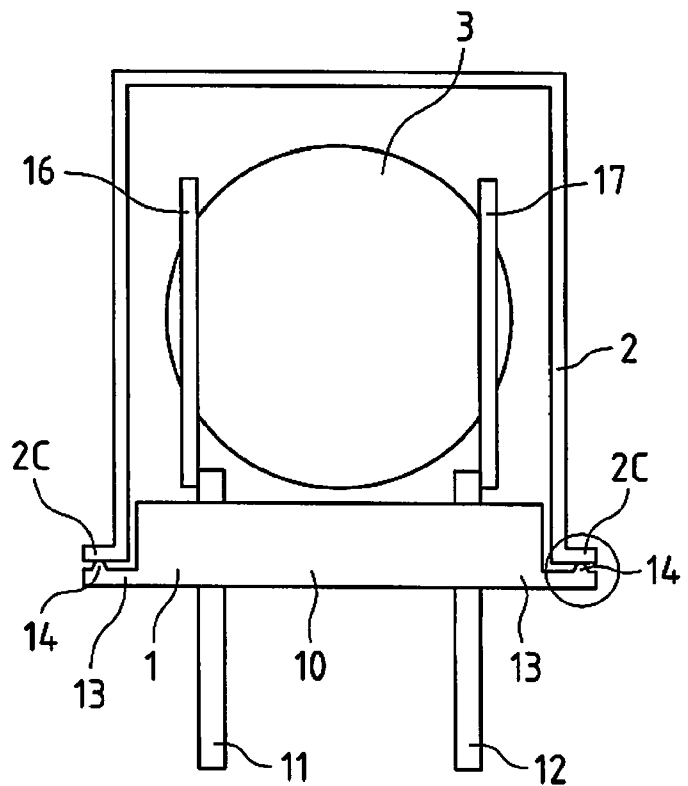
FIG. 1 is an internal cross section of an embodiment of the present invention.
Figure 2:
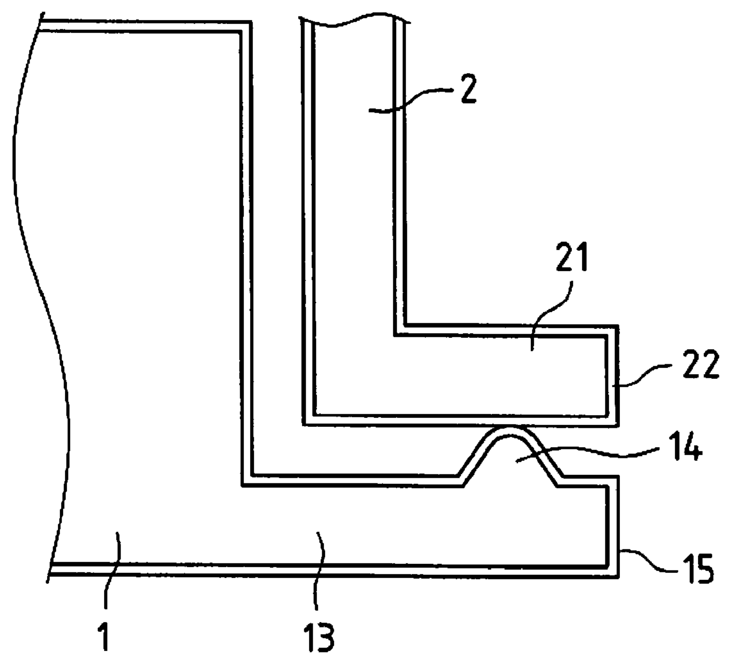
FIG. 2 is an enlarged cross-sectional view of a flange of a metal base and a flange portion of a metal cap in FIG. 1.
Figure 3:
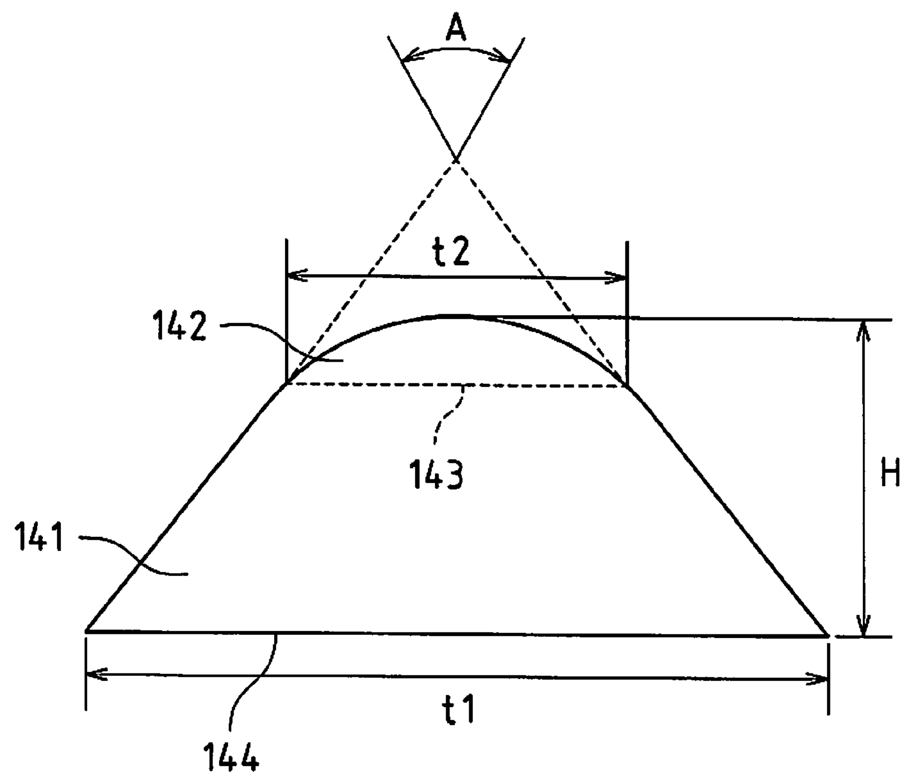
FIG. 3 is an enlarged cross-sectional view of a protrusion on the flange of the metal base in FIG. 2.

Next, embodiments of the present invention will be described through reference to the drawings, using a crystal resonator as an example of an electronic component package. FIG. 1 is an internal cross-sectional view of an embodiment of the present invention, and FIG. 2 is an enlarged cross-sectional view of a flange of a metal base and a flange portion of a metal cap in FIG. 1. FIG. 3 is an enlarged cross-sectional view of the protrusion on the flange of the metal base.

A metal base 1 includes a base main body 10 and metal lead terminals 11 and 12. The base main body 10 has a slender cylinder shape and is low in height overall, and is made of iron, Kovar, or the like.

A peripheral flange 13 that extends outward is provided integrally to the lower peripheral edge of the base main body 10. A protrusion 14 (projection) is formed integrally on top of the flange 13.

The metal lead terminals 11 and 12, which are slender and cylindrical in form, are erected passing through the base main body 10, which mainly includes a metal shell, via insulating glass (not shown). Through-holes (not shown) for filling the insulating glass are provided to the base main body 10, and when the insulating glass is filled into the through-holes in the base main body 10, the metal lead terminals 11 and 12 are electrically independent from one another.

A metal coat 15 of nickel is formed by plating or another such means (electroplating or electroless plating) in a thickness of 2 to 6 μm as a metal coat for rustproofing at least on the surface of the base main body 10 of the metal base 1. It is particularly favorable for the nickel or other metal coat 15 to be formed on the metal base 10 in a thickness of 6 μm or less, which eliminates peeling of plating of the metal coat 15 (nickel plating) and better suppresses the occurrence of splash. Also, if the thickness is not at least 2 μm, the metal base 10 will have less of a rustproofing effect and there will be less improvement to the aging characteristics of the crystal resonator, and this can lead to a decrease in electrical characteristics with an electronic component (the crystal resonator) after being hermetically sealed. In this embodiment, nickel plating is formed by electroplating the base main body 10, after which the metal lead terminals 11 and 12 are erected, after which the metal coat 15 is formed by electroless nickel plating. When electroplating and electroless plating are thus combined as in this embodiment, the metal coat 15 can be formed by plating without any gaps between it and the base main body 10. The metal coat 15 is not limited to being nickel plating, and may be formed by combining gold plating or copper plating with nickel plating, for example. The thickness is preferably the same.

Supports 16 and 17 are disposed opposite each other on the inner leads of the lead terminals 11 and 12, where they are welded by spot welding, laser welding, or another such method. A crystal resonator plate 3, serving as the electronic component element ("element") discussed below, is placed on the supports 16 and 17 via an electroconductive joining material (not shown).

A metal cap 2 is in the form of a hollow, oval cylinder that is open at the bottom, and is made of nickel silver, iron, Kovar, or the like. The open portion thereof has a flange 21 corresponding to the flange 13 of the metal base 1. A metal coat 22 of nickel is formed as a rustproofing metal coat in a thickness of 0.5 to 4.0 μm by plating or another such method (flash electroplating, or flash electroplating and electroless plating) on the surface of the metal cap 2.

The crystal resonator plate 3 serving as the electronic component element includes AT cut crystal, and is worked into the form of a disk, for example. The front and back sides thereof are provided with excitation electrodes and take-off electrodes (not shown) by vacuum vapor deposition, sputtering, or another such means. For electrical connection to be carried out properly, the take-off electrodes may be wrapped around to the other main face of the crystal resonator plate 3. That is, the take-off electrodes may be taken off on either of the main faces of the crystal resonator plate 3.

The crystal resonator plate 3 is placed on the supports 16 and 17 of the metal base 1 configured as above, and are electro-mechanically joined by an electroconductive resin adhesive, braze, or another such electroconductive joining material (not shown). The crystal resonator plate 3 is covered by placing the metal cap 2 over the metal base 1 on which the crystal resonator plate 3 has thus been mounted, power is turned on in a state in which the flange 21 of the metal cap 2 has been press-bonded with the protrusion 14 on the flange 13 of the metal base 1, and this melts the protrusion 14 and the metal coats 15 and 22 of nickel, thereby joining the metal base 1 and the metal cap 2 by resistance welding, and the crystal resonator plate 3 is hermetically sealed to complete the crystal resonator.

The protrusion 14 of the metal base 1 is a characteristic feature of this embodiment, so it will be described in detail here. The protrusion 14 has a cross sectional shape that combines an arc member 142 on the top side of an isosceles trapezoid 141, and an apex angle A formed by extensions of the two equal sides of the trapezoid is set to a range of from 60° to 90°. The cross sectional height H of the protrusion 14 here (from the bottom side of the trapezoid to the apex of the arc member) is set to between 0.04 and 0.12 mm.

The protrusion 14 according to this embodiment is, for example, configured such that an apex angle A formed by extensions of the two equal sides of the trapezoid 141 in a cross section of the protrusion 14 is 70°, the length t1 of the trapezoid bottom side 144 is 0.182 mm, the length t2 of the trapezoid top side 143 is 0.07 mm, the radius R of the arc member 142 is 0.067 mm, and the cross sectional height H of the protrusion 14 (from the bottom side of the trapezoid to the apex of the arc member) is 0.08 mm.

The cross sectional shape of the protrusion 14 in this embodiment is formed such that the arc member 142 is formed integrally (combined) with the top side of the trapezoid 141 simultaneously with the formation of the flange 13 and the protrusion 14 by stamping the base main body 10 of the metal base 1. The final cross sectional shape is then obtained by etching the base main body 10 with a mixture of hydrogen peroxide and acidic ammonium fluoride or another such etchant. As to the formation of the protrusion 14, a good anti-splash effect can be obtained with just stamping, but combining etching after stamping is preferable in the formation of the protrusion 14. Specifically, stamping will yield an accurate protrusion shape with higher precision, which suppresses the formation of a bulging portion in the protrusion 14 during pressing, which would otherwise lead to splash. Furthermore, subsequent etching gives the protrusion a smoother shape, and any stamping burrs can be removed if they should occur, so the formation of a bulge in the protrusion 14 is further suppressed. As a result, the occurrence of splash can be suppressed.

The effect of using the above constitution is that when the metal cap 2 is pressed against the protrusion 14 of the metal base 1 during resistance welding, the stress applied to the apex portion of the protrusion 14 is dispersed, the formation of a bulge in the protrusion 14 is sharply reduced, and the occurrence of splash is markedly suppressed. As a result, any metal microparticles caused by splash will not find their way inside the metal base 1, so those metal microparticles will not adhere to the surfaces of the metal thin film electrodes of the crystal resonator plate 3 (the excitation electrodes and take-off electrodes), which completely eliminates electrode shorting, capacity fluctuation, and other such adverse effects to the characteristics. Also, since pressure is applied uniformly everywhere except the bulging portion of the protrusion 14 during resistance welding, the pressing force is more stable and the welded region is also more uniform and stable, and as a result there is no variance in joining (sealing) of the metal base 1 and the metal cap 2. A problem is also eliminated in which the crystal resonator is not hermetically sealed due to variance in sealing, diminishing the aging characteristics.

Other Embodiments

Figure 4:
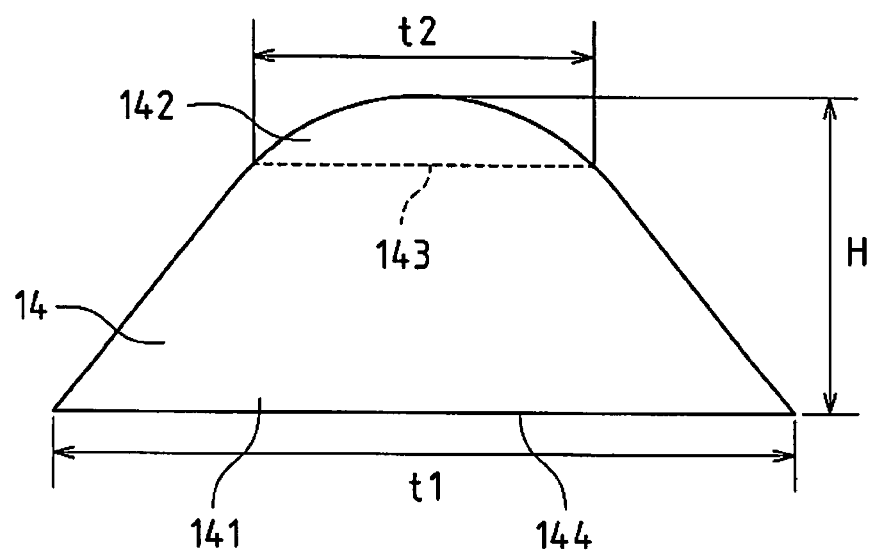
FIG. 4 is an enlarged cross-sectional view of a protrusion on a flange of a metal base in another embodiment of the present invention.

The protrusion 14 need not be defined only by the setting of the apex angle A formed by extensions of the two equal sides of the protrusion, and as shown in FIG. 4, may be defined by the length ratio of the top side 143 and bottom side 144 of the trapezoid 141. For instance, the same anti-splash effect as in the above embodiment can be obtained when the length t2 of the top side 143 of the trapezoid 141 is set to between 25% and 40% of the length t1 of the bottom side 144, the length t1 of the bottom side 144 of the trapezoid 141 is 0.182 mm, and the length t2 of the top side 143 of the trapezoid 141 is set to from 0.0455 to 0.0728 mm versus this length t1. That is, by setting the length of the top side 143 of the trapezoid 141 to be 25% to 40% of the length of the bottom side 144, a state can be maintained in which welding current is locally concentrated in the protrusion 14 during resistance welding, so there is no decrease in welding efficiency, and furthermore this configuration is ideal for suppressing the infiltration of metal microparticles caused by splash. In addition, crushing of the protrusion 14 is kept to a minimum, and the occurrence of splash can be itself suppressed. This is because if the length of the top side 143 of the trapezoid 141 is shorter than 25% of the length of the bottom side 144, the stress applied to the apex portion of the protrusion 14 will not be completely dispersed, a bulge will be more likely to form in the protrusion 14, and as a result the occurrence of splash cannot be suppressed. On the other hand, if the length of the top side 143 of the trapezoid 141 is longer than 40% of the length of the bottom side 144, the welding current cannot be locally concentrated in the protrusion 14 during resistance welding, and resistance welding efficiency decreases, so the resistance welder output will have to be increased for hermetic sealing, and as a result splash will be more apt to occur. Also, this constitution of the protrusion 14 may be combined with the specification of the apex angle formed by extensions of the two equal sides of the protrusion 14 in the above embodiment.

Figure 5:
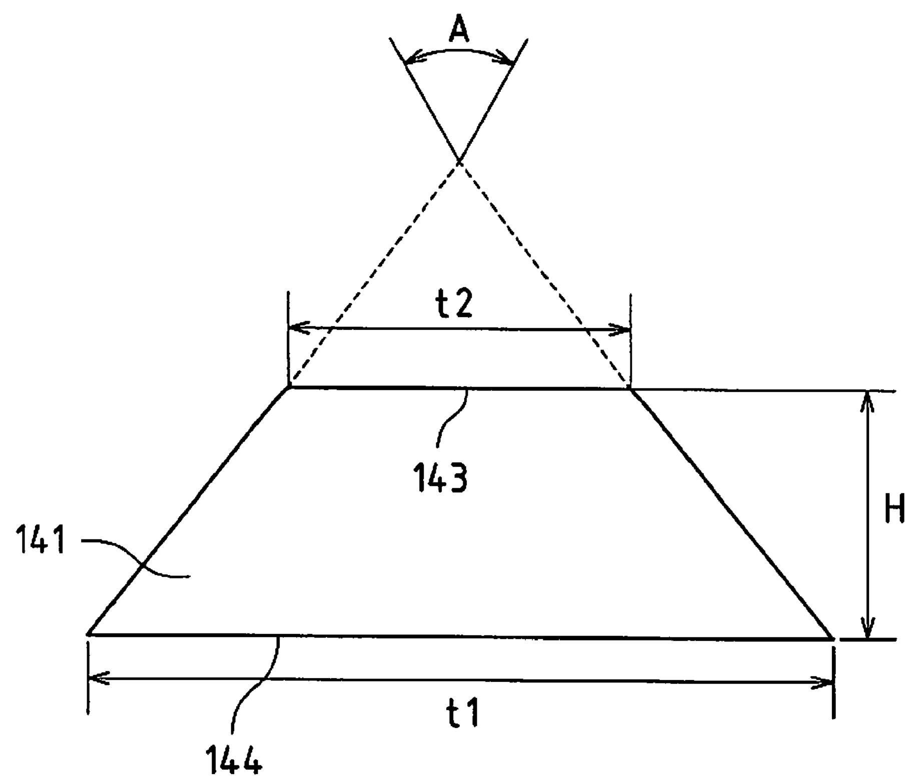
FIG. 5 is an enlarged cross-sectional view of the protrusion on the flange of the metal base in another embodiment of the present invention.

Also, as shown in FIG. 5, a projection tip of the protrusion 14 may have a flat face, and the cross sectional shape of the protrusion 14 may be that of the isosceles trapezoid 141. Further, the apex angle A formed by extensions of the two equal sides of the trapezoid 141 is preferably set within a range of 60° to 90°, and in this mode these are combined. In this mode, for example, the cross sectional height H of the protrusion 14 is set to between 0.04 and 0.12 mm. The apex angle A formed by extensions of the two equal sides of the trapezoid 141 in a cross section of the protrusion 14 is 70°, the length t1 of the bottom side 144 of the trapezoid 141 is 0.182 mm, and the length t2 of the top side 143 of the trapezoid 141 is 0.07 mm versus this length t1. With this constitution, when the metal cap 2 is pressed against the protrusion of the metal base 1 during resistance welding, the stress applied to the apex portion of the protrusion 14 is uniform, the molten metal will quickly connect up with two equal sloped sides of the trapezoid, and the bulging portion of the protrusion 14 is formed along the sloped sides of the trapezoid 141, so the formation of the bulging portion of the protrusion 14 is reduced and the occurrence of splash can be suppressed. As a result, any metal microparticles caused by splash will not find their way inside the metal base 1, so those metal microparticles will not adhere to the electrode surfaces of the crystal resonator plate 3 or other electronic component element, which completely eliminates electrode shorting, capacity fluctuation, and other such adverse effects to the characteristics.

Figure 6:
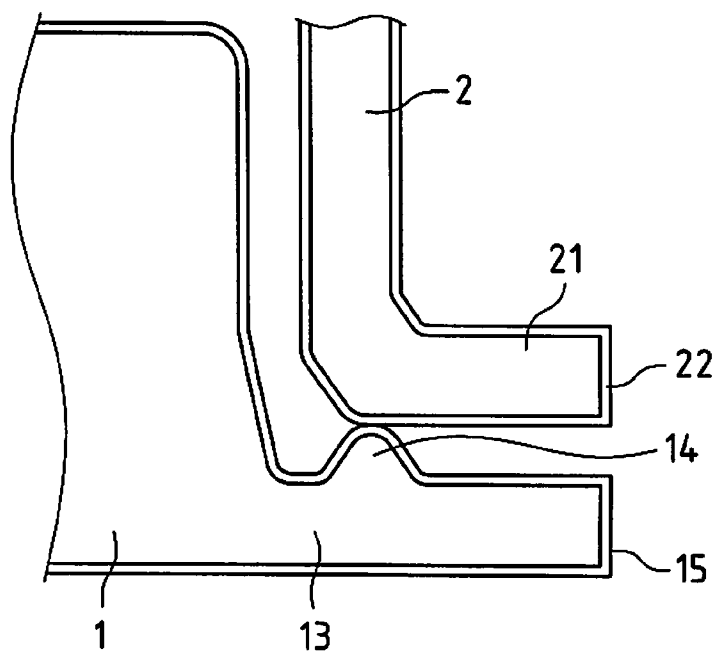
FIG. 6 is an enlarged cross-sectional view of the flange of the metal base and a flange portion of a metal cap in another embodiment of the present invention.

As shown in FIG. 6, the location where the protrusion 14 is formed on the flange 13 may be different from that shown in FIG. 2. More specifically, the protrusion 14 shown in FIG. 6 is not formed near the outer edge of the flange 13 (near the outer peripheral edge of the metal base 1) as shown in FIG. 2, but rather near the inner edge of the flange 13 (toward the metal base 1). The protrusion 14 shown in FIG. 6 has the same shape as the protrusion 14 shown in FIG. 2. Also, with the metal base 1 and the metal cap 2 shown in FIG. 6, in addition to the protrusion 14 being formed at a location on the flange 13 that is near the inside of the flange 13 (toward the metal base 1), the boundary between the convex and concave shapes (such as the boundary between the base main body 10 and the flange 13, or the boundary between the flange 21 of the metal cap 2 and another part) is formed curved in cross section. Therefore, a gap can be formed at the boundary between the convex and concave shapes of the metal base 1 and the metal cap 2, and the discharge commencement voltage can be set higher in this gap when the metal base 1 and the metal cap 2 are resistance welded. As a result, there is less discharge at this gap, and splash can be suppressed.

Figure 7:
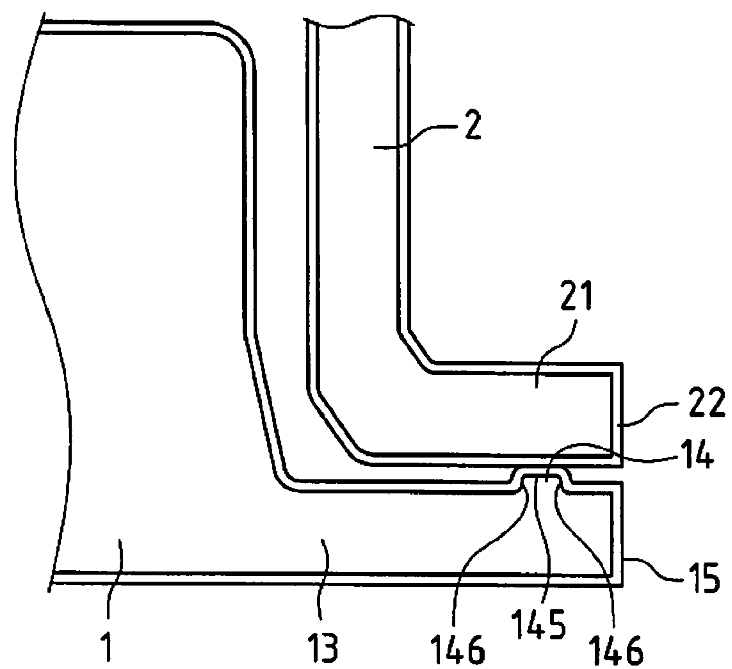
FIG. 7 is an enlarged cross-sectional view of the flange of the metal base and the flange portion of the metal cap in another embodiment of the present invention.

The protrusion 14 is not limited to the shapes discussed in the embodiments above, and may have the shape shown in FIG. 7, as long as a projection tip of the protrusion 14 has a flat face.

The protrusion 14 shown in FIG. 7 is rectangular in cross section, with a projection tip 145 of the protrusion being a flat face, and corners 146 on this protrusion 14 are curved faces. In this mode, the length of the flat face of the projection tip (the top side 143) of the protrusion 14 is set to be at least two times the height thereof. Also, the ratio of the length of the bottom side (bottom face) of the protrusion 14 to the length of the flat face of the projection tip is set to 2:1. If the protrusion 14 dimensions are set in this way, the metal base 1 and the metal cap 2 will be in a more stable state of contact, and the protrusion 14 will be flattened no more than necessary when the metal cap 2 is pressed against the protrusion 14 of the metal base 1 during resistance welding, the result of which is that splash can be suppressed. Furthermore, since the ratio of the length of the bottom side of the projection tip to the length of the flat face is set to 2:1, there will be less crushing of the protrusion 14 under pressure during resistance welding, there will be less variance in the amount of pressure (pressing in) of the protrusion 14 against the metal base 1, stable resistance welding can be performed with no variance in the power conduction region, and as a result splash can be suppressed.

Also, the height (in cross section) of the protrusion 14 according to the mode shown in FIG. 7 is set to 50 μm or less (the protrusion 14 shown in FIG. 7 is 50 μm tall). When the metal base 1 and the metal cap 2 are joined by resistance welding, they are press-bonded until the height (in cross section) of the protrusion 14 is about 30 to 40 μm, and the gap between the metal base 1 and the metal cap 2 is about 3 to 15 μm. Just as with the mode shown in FIG. 6, the boundary between the convex and concave shapes of the metal base 1 and the metal cap 2 shown in FIG. 7 (such as the boundary between the base main body 10 and the flange 13, or the boundary between the flange 21 of the metal cap 2 and another part) is formed curved in cross section. Therefore, a gap can be formed at the boundary between the convex and concave shapes of the metal base 1 and the metal cap 2, and the discharge commencement voltage can be set higher in this gap when the metal base 1 and the metal cap 2 are resistance welded. As a result, there is less discharge at this gap, and splash can be suppressed.

With the protrusion 14 shown in FIG. 7, the metal base 1 and the metal cap 2 are joined by resistance welding, the crystal resonator plate 3 is hermetically sealed, and the occurrence of splash is suppressed, so it will have no adverse effect on the characteristics of the crystal resonator, and variance will be less likely to occur during hermetic sealing.

Also, as shown in FIG. 7, since the height (in cross section) of the protrusion 14 is set to 50 μm or less, the height (in cross section) of the protrusion 14 is about 30 to 40 μm when the metal cap 2 and the metal base 1 are joined, and the gap between the metal base 1 and the metal cap 2 is about 3 to 15 μm, the discharge that occurs during resistance welding of the metal cap 2 and the metal base 1 can be suppressed, and as a result, the occurrence of splash can be drastically reduced.

Figure 8:
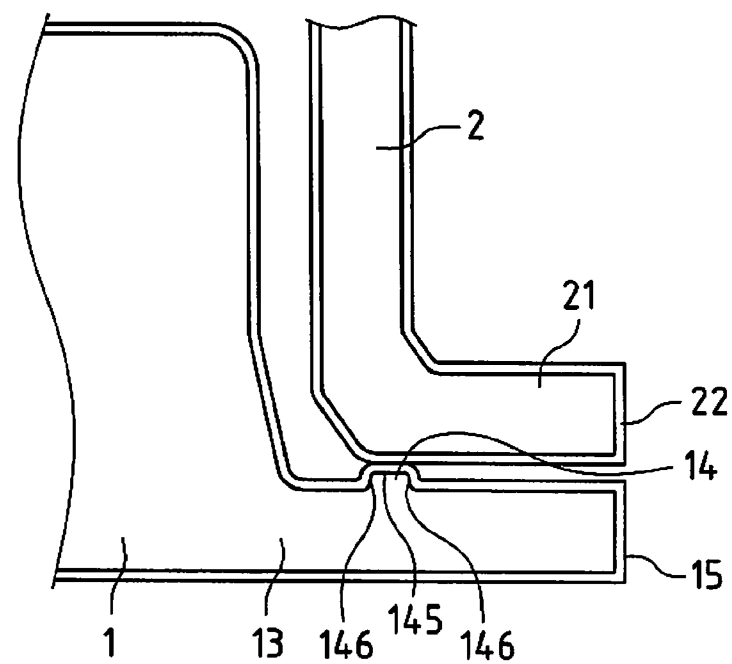
FIG. 8 is an enlarged cross-sectional view of the flange of the metal base and the flange portion of the metal cap in another embodiment of the present invention.

The position where the protrusion 14 shown in FIG. 7 is formed on the flange 13 is not limited to near the outer edge of the flange 13 shown in FIG. 7, and just as with the protrusion 14 shown in FIG. 6, it may be formed near the inner edge of the flange 13 as shown in FIG. 8. Just as with the mode shown in FIG. 7, the boundary between the convex and concave shapes of the metal base 1 and the metal cap 2 shown in FIG. 8 is formed curved in cross section. Therefore, a gap can be formed at the boundary between the convex and concave shapes of the metal base 1 and the metal cap 2, and the discharge commencement voltage can be set higher in this gap when the metal base 1 and the metal cap 2 are resistance welded. As a result, there is less discharge at this gap, and splash can be suppressed.

The various modes discussed above were described through reference to the corresponding drawings, but the drawings according to these modes do not depict the completion of a crystal resonator by joining the metal base 1 and the metal cap 2, and are merely intended to illustrate the metal base 1 and the metal cap 2.

In view of this, the mode shown in FIG. 7 will now be used as an example to describe the joining of the metal base 1 and the metal cap 2.

First, the crystal resonator plate 3 is placed on the supports 16 and 17 of the metal base 1 and electro-mechanically joined with an electroconductive resin adhesive, braze, or another such electroconductive joining material (not shown). The crystal resonator plate 3 is covered by placing the metal cap 2 over the metal base 1 on which the crystal resonator plate 3 has thus been mounted, producing the arrangement of the metal base 1 and the metal cap 2 shown in FIG. 7.

Figure 9:
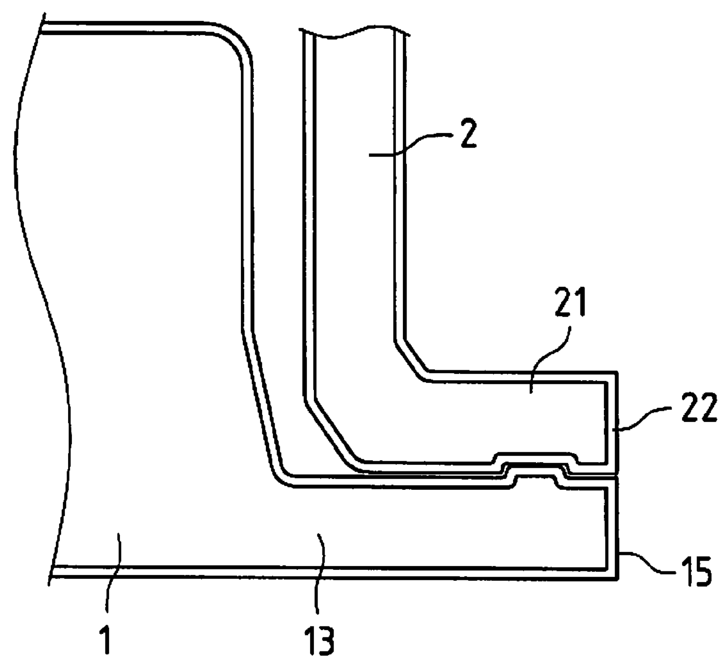
FIG. 9 is an enlarged cross-sectional view of the flange portion in a state in which the metal base and the metal cap shown in FIG. 7 have been press-bonded.

After the metal base 1 and the metal cap 2 have been laid out in the state shown in FIG. 7, the protrusion 14 on the flange 13 of the metal base 1 and the flange 21 of the metal cap 2 are press-bonded as shown in FIG. 9. At this point, a depression that matches the shape of the protrusion 14 is formed in the metal cap 2, and a projection tip of the protrusion 14 is crushed. Due to "crushing" of the protrusion 14 referred to here, the height of the protrusion 14 (in cross section) decreases to from 30 to 40 μm.

Figure 10:
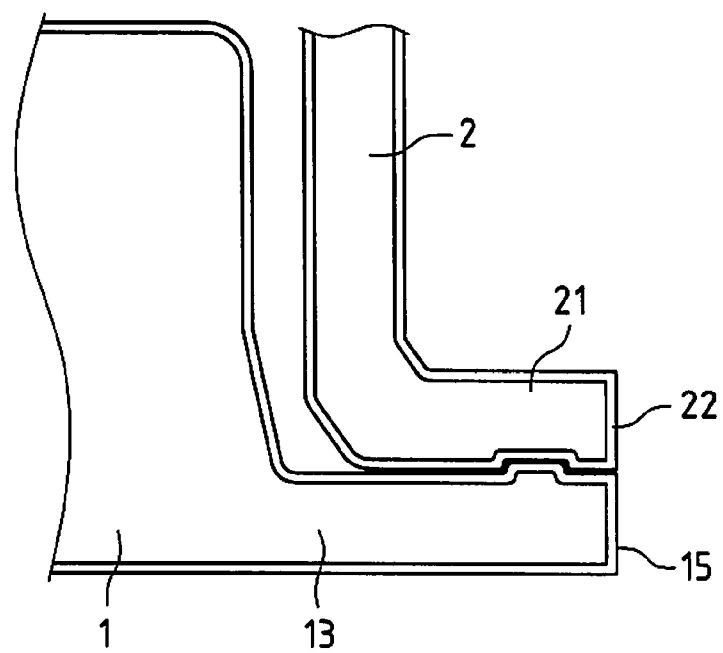
FIG. 10 is an enlarged cross-sectional view of the flange portion in a state in which the metal base and the metal cap shown in FIG. 7 have been press-bonded.
Figure 11:
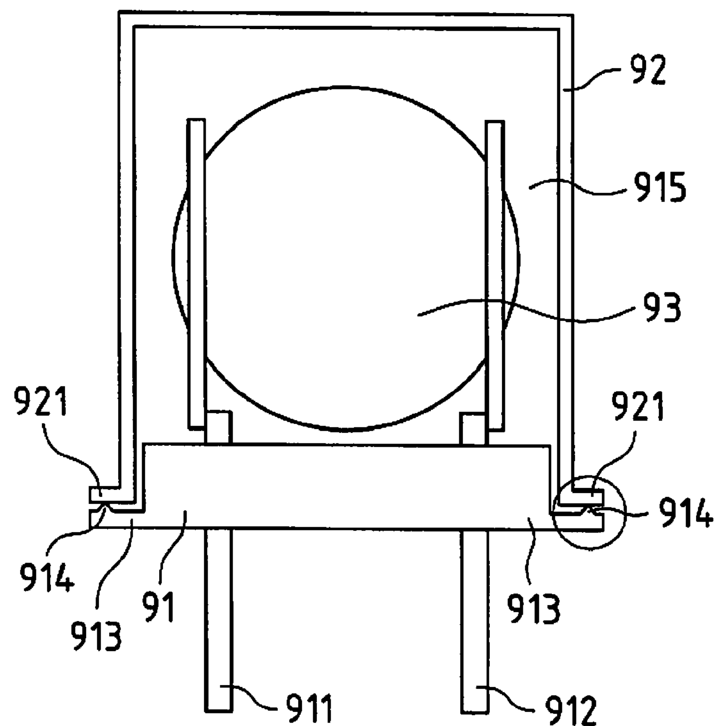
FIG. 11 is an internal cross-sectional view of a conventional embodiment.
Figure 12:
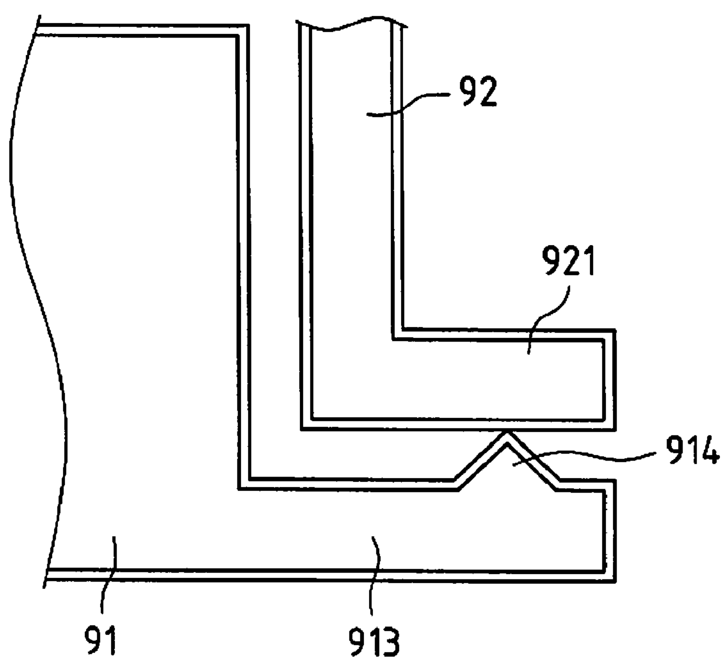
FIG. 12 an enlarged cross-sectional view of a flange of a metal base and a flange portion of a metal cap in FIG. 11.

After the flange 21 of the metal cap 2 and the protrusion 14 on the flange 13 of the metal base 1 have been press-bonded as shown in FIG. 8, power is turned on in this bonded state, so that as shown in FIG. 10, the protrusion 14 and the metal coats 15 and 22 of nickel melt, the metal base 1 and the metal cap 2 are joined by resistance welding, and the crystal resonator plate 3 is hermetically sealed, which completes the crystal resonator.

As discussed above, with the various modes above, the occurrence of splash is suppressed so that it has no adverse effect on the characteristics of the crystal resonator (the electronic component), and furthermore variance will be less likely to occur during hermetic sealing. More specifically, during the resistance welding of the metal base 1 and the metal cap 2, no metal microparticles will scatter from the protrusion 14 (such as the projection tip 145), and there will be no unevenness in the welded region.

Also, the examples of the present invention were described using a crystal resonator, but the electronic component is not limited to this. It should go without saying that the present invention can be applied to packages of all electronic components that are hermetically sealed by resistance welding, such as piezoelectric filters, piezoelectric oscillators, ceramic vibrators, ceramic filters, SAW resonators, SAW filters, capacitors, resistors, pyroelectric sensors, semiconductor elements, and other such electronic components.

Furthermore, the present invention can be worked in various other forms without departing from the main features of the essence thereof. Therefore, the embodiments given above are in all respects nothing but examples, and should not be construed as being limiting in nature. The scope of the present invention is indicated by the Claims, and is not restricted in any way by the text of the Specification. Moreover, all changes and modifications belonging to the equivalent range of the Claims are within the scope of the present invention.

This application claims priority rights on the basis of Japanese Patent Application 2006-309593 submitted in Japan on Nov. 15, 2006. The entire content thereof is incorporated into the present application by reference thereto.

Industrial Applicability

The present invention can be applied to any electronic component in which an electronic component element is hermetically sealed, and is particularly favorable for piezoelectric resonator devices that make use of piezoelectric resonator elements as electronic component elements.

The invention claimed is:

1. An electronic component package, in which an electronic component element is mounted on a metal base, the electronic component element is covered by placing a metal cap over the metal base with a gap between the metal base and the metal cap of 3 to 15 μm, and the metal base and the metal cap are resistance welded to hermetically seal the electronic component element, wherein a protrusion is provided to a portion of the metal base that comes into contact with the metal cap, and a projection tip of the protrusion has a flat face.

2. The electronic component package according to claim 1, wherein a protrusion is provided to the portion of the metal base that comes into contact with the metal cap, and the protrusion has an isosceles trapezoidal cross sectional shape.

3. The electronic component package according to claim 2, wherein the protrusion has an isosceles trapezoidal cross sectional shape, and an apex angle formed by extensions of the two equal sides of the trapezoid is set to a range of from 60° to 90°.

4. The electronic component package according to claim 1, wherein the height of the protrusion is set to 50 μm or less.

5. The electronic component package according to claim 1, wherein a metal coat of nickel is formed in a thickness of 2 to 6 μm on the surface of the metal base.

6. The electronic component package according to claim 1, wherein the metal base that comes into contact with the metal cap is a flange that extends outward, and the protrusion is formed on the flange.

* * * * *